US006362520B2

(12) United States Patent
DiStefano

(10) Patent No.: US 6,362,520 B2
(45) Date of Patent: *Mar. 26, 2002

(54) MICROELECTRONIC MOUNTING WITH MULTIPLE LEAD DEFORMATION USING RESTRAINING STRAPS

(75) Inventor: Thomas H. DiStefano, Monte Sereno, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/791,245

(22) Filed: Feb. 22, 2001

Related U.S. Application Data

(60) Continuation of application No. 09/385,320, filed on Aug. 30, 1999, now Pat. No. 6,208,024, which is a division of application No. 08/989,582, filed on Dec. 12, 1997, now Pat. No. 5,976,913.
(60) Provisional application No. 60/045,690, filed on May 6, 1997, and provisional application No. 60/033,066, filed on Dec. 12, 1996.

(51) Int. Cl.[7] .......................... H01L 23/48; H01L 23/52; H01L 29/40; H01L 21/44; H01L 21/48
(52) U.S. Cl. .......................... 257/696; 257/692; 257/734; 257/773; 438/117; 438/123
(58) Field of Search .................. 257/692, 693, 257/696, 734, 773; 438/117, 121, 123, 125

(56) References Cited

U.S. PATENT DOCUMENTS

| 5,518,964 | A | 5/1996 | DiStefano et al. .......... 438/126 |
| 5,688,716 | A | 11/1997 | DiStefano et al. ............ 438/55 |
| 5,763,941 | A | 6/1998 | Fjelstad ...................... 257/669 |
| 6,063,648 | A | 5/2000 | Beroz et al. ................ 438/113 |
| 6,191,473 | B1 | * 2/2001 | Disterfano .................. 257/691 |

FOREIGN PATENT DOCUMENTS

JP  3-263109  11/1991

* cited by examiner

*Primary Examiner*—Allan R. Wilson
(74) *Attorney, Agent, or Firm*—Lerner, David, Littenberg, Krumholz & Mentlik, LLP

(57) ABSTRACT

A microelectronic assembly includes a first microelectronic element including contacts on a contact-bearing face and a second microelectronic element confronting the first microelectronic element. The assembly also has a plurality of vertically extended signal leads electrically interconnecting the first and second microelectronic elements, and a plurality of vertically extended straps attached to the first and second microelectronic elements, whereby the straps are shorter than the signal leads for limiting vertical movement of the first and second microelectronic elements away from one another.

44 Claims, 4 Drawing Sheets

MICROELECTRONIC MOUNTING WITH MULTIPLE LEAD DEFORMATION USING RESTRAINING STRAPS

CROSS-REFERENCE TO RELATED APPLICATIONS

The present application is a continuation of U.S. patent application Ser. No. 09/385,320, filed Aug. 30, 1999, now U.S. Pat. No. 6,208,024 which is a divisional of U.S. Pat. application Ser. No. 08/989,582, filed Dec. 12, 1997, now U.S. Pat. No. 5,976,913, which in turn claims benefit of U.S. Provisional Application Ser. No. 60/045,690, filed May 6, 1997 and Ser. No. 60/033,066, filed Dec. 12, 1996. The disclosures of the above-mentioned applications are hereby incorporated by reference herein.

BACKGROUND OF THE INVENTION

The present invention relates to methods and components for making microelectronic assemblies. Complex microelectronic devices such as modern semiconductor chips require numerous connections to other electronic components. For example, a complex microprocessor chip may require many hundreds of connections to external devices.

As disclosed in U.S. Pat. No. 5,518,964, the disclosure of which is also incorporated by reference herein, flexible connections can be provided between microelectronic elements using a process in which the leads are connected between the elements and the elements are then moved through a predetermined displacement relative to one another so as to deform the leads. For example, a first element may be a microelectronic connection component which includes a dielectric element such as a flexible sheet having a bottom surface. A plurality of leads are also provided. Each lead has a terminal end permanently attached to the dielectric element and a tip end remote from the terminal end. Each lead initially extends in a horizontal plane, generally parallel to the bottom surface of the dielectric sheet. Desirably, the tip ends of the leads are releasably connected to the dielectric element. While the leads are in this condition, the tip ends are attached to a second element, such as a further dielectric sheet, a semiconductor chip, a semiconductor wafer or other microelectronic element. After the tip ends of the leads have been attached to the second element, the first and second elements are moved away from one another, so that the tip ends of the leads are pulled away from the first element and bent to a vertically extensive configuration. In this condition, the leads are flexible and allow movement of the first and second elements relative to one another. Preferably, a curable liquid material is introduced between the elements to form a compliant layer therebetween. Thus, in the completed assembly the first and second elements are movable relative to one another.

As further described in the '964 patent, these arrangements offer numerous advantages. The resulting assembly provides mechanical decoupling between the elements, and thus provides compensation for thermal expansion and warpage of the elements. The preferred processes according to the '964 patent can make a large number of connections in a single operation. For example, where a wafer incorporating numerous chips is used as one element in the connection process, all of the leads to all of the chips can be connected in a single set of operations. The resulting wafer-scale assembly can be severed to provide numerous individual units, each including one or more chips. Further variations, improvements and adjuncts to the processes and components taught in the '964 patent are also disclosed in U.S. Pat. No. 5,688,716, and in copending, commonly assigned U.S. patent applications Ser. No. 08/532,528 Filed Sept. 22, 1995; Ser. No. 08/678,808 Filed Jul. 12, 1996; and Ser. No. 08/690,532 Filed Jul. 31, 1996, the disclosures of which are also incorporated by reference herein.

Despite the advances in the art discussed above, still further improvements would be useful.

SUMMARY OF THE INVENTION

One aspect of the present invention provides methods of making a microelectronic assemblies. A method in accordance with this aspect of the invention desirably includes the steps of providing a pair of elements having a plurality of signal leads attached to said elements and electrically interconnecting said elements, and also having a plurality of straps attached to said elements, said signal leads and said straps extending generally in a horizontal direction. The method further includes the step of moving the elements vertically away from one another so that said straps and said signal leads are bent to a vertically extensive disposition. In the moving step, the straps at least partially constrain movement of the elements relative to one another. However, the signal leads most preferably do not constrain this movement. Stated another way, the straps control the relative movement so that the signal leads are not pulled taut and placed under tension between the elements. Accordingly, little stress is applied to the relatively delicate signal leads and their connections to the microelectronic elements. The straps may be considerably stronger than said signal leads. The straps may also be shorter than the signal leads so that as the elements move away from one another, the straps will be pulled taut before the signal leads. Typically, the straps are less numerous than the signal leads.

The straps may also be electrically connected to the microelectronic elements so that the straps further electrically interconnect the elements. In a particularly preferred arrangement, the elements include constant-potential connections such as power or ground connections and some or all of the straps are electrically connected between constant-potential connections on both of said elements. Thus, the straps may serve as power leads, ground leads or both in the finished assembly.

The elements may include opposed, horizontally-extending surfaces of said elements confronting one another and the signal leads and said straps may be disposed between these opposed surfaces. For example, one of the elements may be a connection component including a structure such as a dielectric sheet having a bottom surface, whereas the second element may include one or more semiconductor chips having top surfaces with contacts thereon. The leads and straps may be provided on the bottom surface of the connection component, so that the leads and straps extend along the bottom surface of the connection component, and the connection component may be positioned with the bottom surface facing the top surfaces of the chips. The leads and straps may be connected between the elements by bonding ends of the leads and straps to the top surfaces of the chips.

Each strap may have a first end connected to a first one of the elements and a second end connected to a second one of the elements. Before the moving step, the second end of each strap may be offset from the first end of that strap in a first horizontal direction. In this arrangement, the straps will constrain the first element to move relative to the second element in the first horizontal direction during the moving step. Each signal lead may also have first and second ends connected to the first and second elements, respectively. Prior to the moving step, the second end of each lead may be offset from the first end of the lead in the first horizontal direction. Thus, the movement of the first element with a component of motion in the first horizontal direction will cause the ends of each said signal lead to move horizontally towards one another while the lead ends move vertically away from one another as the elements move away from one another. Where the signal leads are initially straight, this compound movement can bend the leads into a generally S-shaped configuration.

The step of moving the elements vertically away from one another may include the step of applying a fluid under pressure between opposed surfaces of the elements so that the fluid forces the elements away from one another. Because the movement of the elements relative to one another is constrained by the straps, there is no need to use external mechanical elements to control the movement.

A further aspect of the present invention provides connection components for making microelectronic assemblies. A connection component according to this aspect of the invention desirably includes a structural element, and a plurality of flexible signal leads, each such lead having a fixed end permanently attached to the structural element and a free end detachably secured to the structural element. The component also includes a plurality of flexible straps. Each strap has a fixed end permanently attached to the structural element and a free end detachably secured to the structural element. Most preferably, the straps are shorter and stronger than the leads, and the straps are disposed adjacent the leads. The structural element may have a surface with the straps and the leads extending along the surface. The straps and the leads desirably are disposed in an array on the bottom surface and the leads are interspersed with the straps in the array. The structural element may be a dielectric element such as a flexible dielectric sheet or may be a semiconductor chip or wafer.

As discussed above in connection with the method, the free end of each the lead may be offset from the fixed end of that lead in a first horizontal direction along the bottom surface, and the free end of each the strap may be offset from the fixed end of that strap in the same first horizontal direction. Components in accordance with this aspect of the invention may be used in methods as discussed above.

DETAILED DESCRIPTION

Figure 1:
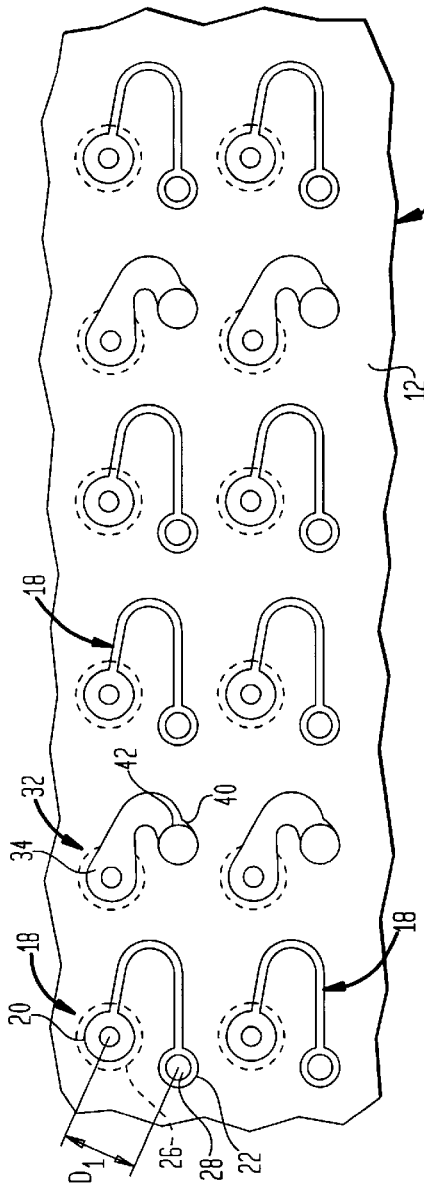
FIG. 1 is a fragmentary diagrammatic bottom view, taken along lines I—I in FIG. 2, depicting the first element used in the structure of FIG. 2.

An assembly in accordance with one embodiment of the invention includes a first element or connection component 10. The connection component includes a flexible sheet dielectric structure 11 having a bottom surface 12, a top surface 14, and a set of conductive power and ground planes extending parallel to these surfaces. One such conductive plane 16 is visible in the drawing figures; the others (not shown) extend inside the dielectric structure or on its surfaces. The dielectric structure 11 of the connection component may include one or more sheets of a flexible but substantially inextensible dielectric material such a polyimide or other or other known dimensionally stable polymeric films used in the semiconductor industry. The dielectric sheet desirably is about 25–35 microns thick. The conductive planes may be formed as thin, flexible metal layers such as copper layers formed by conventional additive or subtractive plating and etching processes.

A large number of electrically conductive signal leads 18 are provided on bottom surface 12. Each signal lead has a terminal end 20 and a tip end 22. The terminal end of each lead is permanently secured to the dielectric structure of first element 10. In the particular structure illustrated, the terminal end of each lead is secured to the dielectric structure by a metallic via structure 24 extending through the first element and a terminal 26 integral with the structure 24 overlying top surface 14. Because the terminal ends of the leads are permanently attached to the dielectric structure, the terminal ends are also referred to herein as the fixed ends of the leads. The via structures 24 associated with the signal leads extend through holes 30 in conductive planes 16, so that the via structures 24 and the signal leads are insulated from the conductive planes 16. Optionally, some of the signal leads 18 may be connected to the conductive planes by the via structures 24 or by other interconnecting elements (not shown).

The tip end 22 of each lead is provided with a mass of bonding material 28. The tip end of each signal lead 18 is releasably secured to bottom surface 12 of the dielectric sheet 11. As described in greater detail in the aforementioned '964 patent, the tip ends of the leads may be releasably attached to the bottom surface itself by adhesion between the lead material and the bottom surface of the dielectric layer, within a relatively small region disposed between the lead tip end and the bottom surface of the dielectric layer. Alternatively or additionally, the tip ends of the leads may be secured to the bottom surface by frangible elements or may be bonded to the bottom surface of dielectric sheet by a bonding process which provides a relatively low peel strength. Low peel strength connections are described in further detail in copending, commonly-assigned U.S. patent application Ser. No. 08/547,170, filed Oct. 24, 1995, the disclosure of which is incorporated by reference herein. Because the tip ends of the leads can be freed from their attachment to the bottom structure or dielectric sheet, the tip ends are also referred to herein as free ends.

Figure 2:
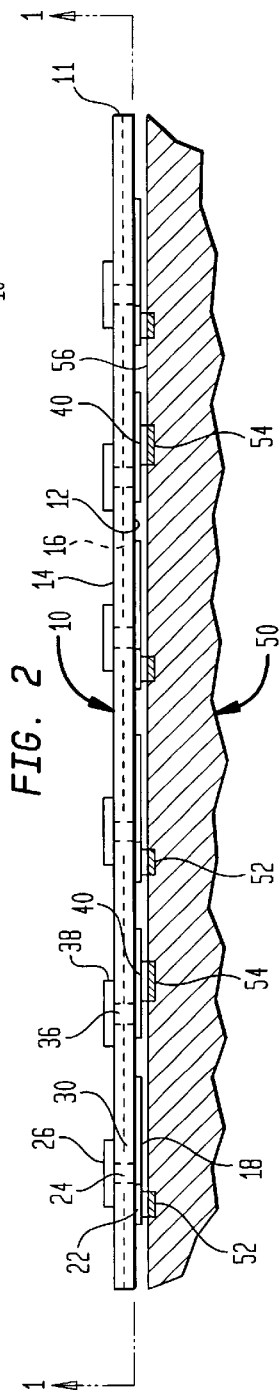
FIG. 2 is a fragmentary, diagrammatic sectional elevational view depicting first and second elements in accordance with one embodiment of the invention after connection of the leads between these elements, but prior to relative movement of these elements.

In the condition illustrated in FIGS. 1 and 2, each lead 18 is curved and extends in a horizontal plane substantially parallel to the bottom surface of the dielectric layer. As used in this disclosure with reference to a structure of microelectronic on or associated with a surface of the component, the term "horizontal" refers to the direction parallel to the component surface. As used with reference to a pair of components having opposed, confronting surfaces, the term "horizontal" refers to the directions along the confronting surfaces. The term "vertical" refers to the direction transverse to the horizontal directions. Thus, in the case of components having confronting surfaces, the vertical directions are the directions from one component toward the other component.

Each signal lead 18 desirably is thin and flexible. The leads may be formed from metallic or other conductive material, alone or in conjunction with a dielectric material such as a polymeric material. The dimensions of the signal leads may be as described in the '964 patent. For example, where the connection component is intended to connect with a microelectronic component having contacts in a rectilinear grid with row and column spacings of about 1000 microns, the leads may be on the order of 35 microns wide, and the distance $D_1$ between the center of the fixed or terminal end 20 and the center of the free or tip end 22 of each lead may be on the order of 500–1000 microns. However, because leads 18 are curved, the length of each lead is considerably longer than the straight-line distance $D_1$. As used in this disclosure with reference to a curved lead or strap, the term "length" should be understood as referring to the shortest distance between the fixed end and the free end, measured along the lead itself. Where the lead is curved, the shortest distance along the lead itself normally will not be a straight line.

A plurality of restraining straps 32 are also provided on the bottom surface 12 of the dielectric sheet or first element 10. As shown in FIG. 2, restraining straps 32 are interspersed in the array of signal leads 18. Thus, the restraining straps are provided at intervals over the area encompassed by the array of restraining straps. The structure of the restraining straps 32 is generally similar to the structure of signal leads 18. Thus, each restraining strap 32 has a fixed or terminal end 34 permanently fastened to the dielectric structure 11 of connection component 10 by a via structure 36 extending through the dielectric sheet and a terminal 38 on the top surface 14. Each restraining strap 32 further has a tip end or free end 40 releasably connected to the bottom surface 12 of the dielectric sheet, each such tip end being provided with a bonding material 42. Most or all of the restraining straps 32 are connected to the potential planes 16, as by interconnection between via structures 36 and one or more of the potential planes, or by other connecting elements (not shown). Different ones of the restraining straps 32 may be connected to different potential planes. For example, some of the restraining straps may be connected to a first potential plane which serves as a power plane whereas other restraining straps 32 may be connected to a second potential plane serving as a ground reference plane. The restraining straps 32 are shorter than signal leads 18. That is, the length of each restraining strap 32, measured along the strap itself, in the manner discussed above, is less than the length of each signal lead 18. Also, restraining straps 32 have larger cross-sectional areas than signal leads 18. For example, the restraining straps may have cross-sectional areas about 1.5 times the cross-sectional areas of the signal leads or more. The masses of conductive bonding material 42 on the tip ends of the restraining straps may cover larger areas than the corresponding masses 28 on the tip ends of the signal leads. In short, the restraining straps are of stronger, more robust construction than the signal leads. Typically, the assembly will include a relatively small number of restraining straps 32 and a relatively large number of signal leads 18. Therefore, any additional area consumed by providing relatively large, robust restraining straps will be minimal.

In an assembly method according to an embodiment of the invention, first element or connection component 10, with the leads thereon, is connected to a second element such as a semiconductor wafer 50. Wafer 50 has signal contacts 52 and ground and power reference contacts 54 distributed over its top surface 56. The tip ends 22 of signal leads 18 are connected to the signal contacts 52 whereas the tip ends 40 of the restraining straps 32 are connected to the reference contacts 54. Depending upon the design of the particular chip or wafer, reference contacts 54 may be larger and more robust than the signal contacts 52. The bottom surface 12 of the first element or connection component, with the leads and straps thereon, is juxtaposed with the top surface 56 of the second element or wafer. The elements are aligned with one another so as to align the tip or free end of each lead and each strap with a contact on the wafer. The bonding materials on the tip ends of the leads are activated to bond the free or tip ends of the leads and straps to the contacts. For example, where the bonding materials 28 and 42 on the leads and straps include a heat-activatable bonding material, heat may be applied while pressing the dielectric element 11 of the connection component toward the wafer. The alignment and bonding steps may be performed as described in the '964 patent. As further set forth in that patent, the dielectric element may be held taut in a rigid frame, and may be reinforced by a reinforcing element (not shown) on the top surface 14 to facilitate accurate alignment over the entire area of the dielectric element.

Figure 3:
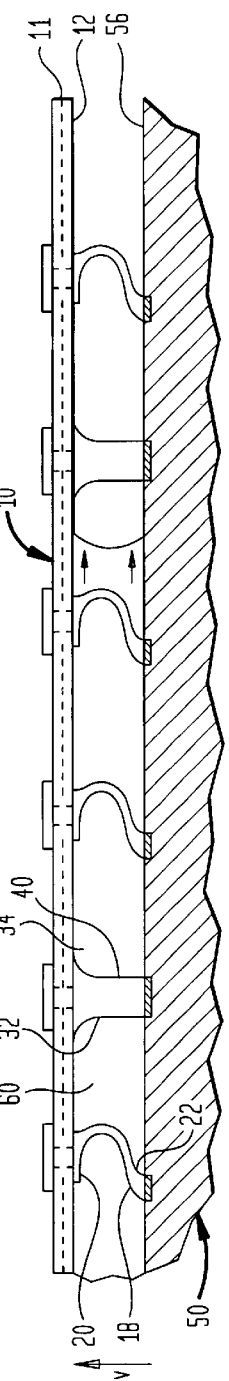
FIG. 3 is a view similar to FIG. 1 but depicting the structure in a later stage of the process, during relative movement of the elements.

After the free or tip ends of the leads and straps have been bonded to the contacts, first element 10 and second element 50 are moved with a component of motion in a vertical direction V away from one another. This may be accomplished by injecting a fluid material such as gas or, preferably, a curable liquid 60, under pressure between the first and second elements. Movement of the first and second elements relative to one another brings the assembly to the condition illustrated in FIG. 3. In this movement, the leads 18 and straps 34 are bent vertically away from the bottom surface of the first element. Thus, the tip end 22 of each lead is moved vertically away from the terminal end 20 of the same lead. This movement is accommodated by the initial curvature of each signal lead, which is partially straightened. Similarly, the tip ends 40 of the restraining straps move vertically away from the terminal ends 34 of the restraining straps. Here again, the vertical movement of the tip ends straightens the initial curvature of the lead. Restraining straps 32 reach a substantially straight, fully extended condition as illustrated in FIG. 3. In this condition, the restraining straps 32 arrest further vertical movement of first element 10 relative to second element 50. Because restraining straps 32 are shorter than signal leads 18, restraining straps 18 will reach this condition while signal leads 18 are still slack and still partially curved. Thus, the restraining straps constrain the movement of the first and second elements away from one another, and assure that such movement ceases before the signal leads are pulled taut.

After the moving step is complete, the curable liquid material is cured to form a compliant layer such as a gel or elastomer between the two elements. The resulting assembly is then severed, as by sawing the assembly to sever the dielectric element, compliant layer and wafer and form individual units. Each unit includes one or more of the semiconductor chips included in the wafer or second element 50, together with the overlying portions of the connection component or first element 10. Each unit provides a packaged semiconductor chip or assembly of chips, which may be mounted to a circuit board or other substrate, as by solder-bonding the terminals 26 and 38 to the substrate. The leads and restraining straps provide electrical interconnection to the substrate, but allow relative movement of the semiconductor chip and the substrate. The curing and severing steps can be performed as described in greater detail in the '964 patent.

As also discussed in the '964 patent, the leads may be provided on the surface of either element as, for example, on the chip or wafer rather than on a dielectric sheet. The same considerations apply to the restraining straps. Also, as described in the '964 patent, the signal leads may be initially straight and the movement of the first and second elements relative to one another may include both a vertical component of motion and a horizontal component of motion. In this embodiment as well, restraining straps in accordance with the present invention may be provided. Here again, the restraining straps will be shorter than the signal leads.

Figure 4:
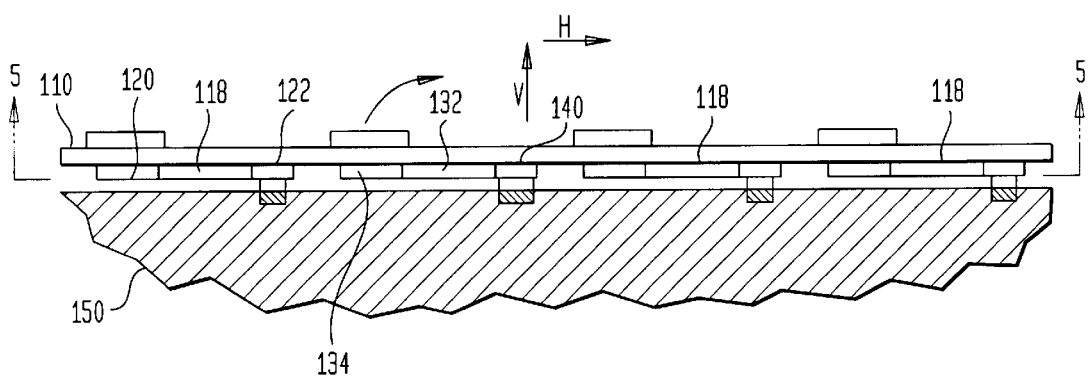
FIGS. 4, 5 and 6 are views similar to FIGS. 1, 2 and 3 respectively, but depicting elements in accordance with a further embodiment of the invention, FIG. 5 being taken along line 5—5 in FIG. 4.
Figure 5:
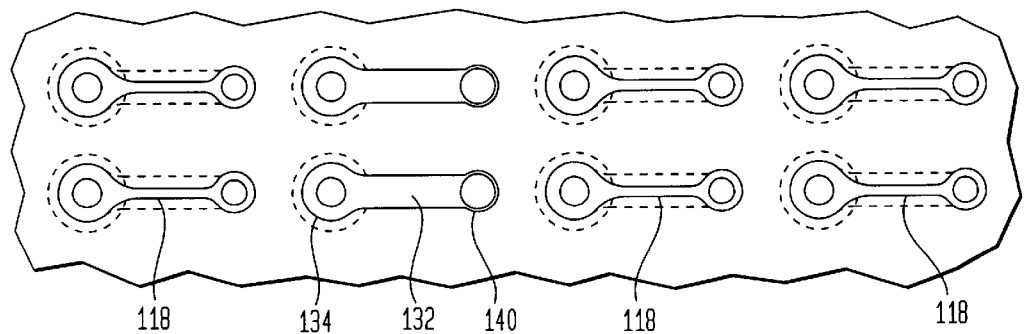

Thus, as shown in FIGS. 4 and 5, straight restraining straps 132 and straight signal leads 118 may be provided. The first element 110 and second element 150 are connected by bonding the free or tip ends 122 of the signal leads to signal contacts on the second element or semiconductor device 150 and by bonding the free or tip ends 140 of restraining straps 132 to contacts such as power or ground contacts on the second element 150 As shown in FIGS. 4 and 5, all of the leads are initially straight. The free or tip end 122 of each lead is offset from the terminal end 120 of the same lead in a first horizontal direction H. The free end 140 of each restraining strap is also offset in first horizontal direction H from the fixed end 134 of the same strap. However, the restraining straps 132 are shorter than the signal leads 118.

Figure 6:
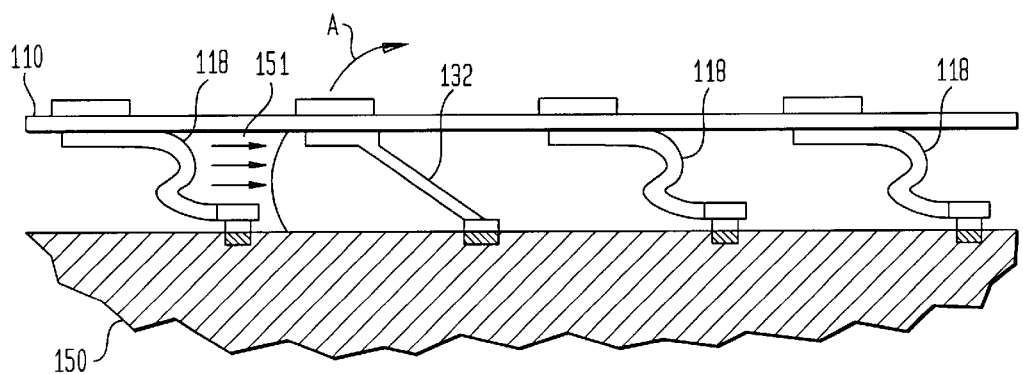

As shown in FIG. 6, when the first element 110 and second element 150 are moved in a vertical direction V away from one another, restraining straps 132 remain taut. The first element 110 thus moves in an arc generally as indicated by the arcuate arrow A relative to the second element. Stated another way, the restraining straps 132 constrain the movement of the first element relative to the second element and constrain first element 110 to move in first horizontal direction H relative to the second element as the first element moves vertically away from the second element. The combined vertical and horizontal motion deforms each of signal leads 118 into a bent, generally S-shaped configuration as shown in FIG. 6. Such horizontal motion will occur without the use of mechanical devices to move the two elements horizontally relative to one another. For example, a fluid such as a gas or, preferably, a curable liquid encapsulant such as an elastomer 151 may be injected under pressure between the first and second elements. This pressure will force the elements away from one another in the vertical direction. The restraining straps will constrain the first element to move horizontally relative to the second element during this process.

Although it is advantageous to use the restraining straps as power or ground connections in the manner discussed above, the same is not essential. For example, the restraining straps may be connected to "dummy" contacts on the chip or wafer, and may serve no electrical function whatsoever. Alternatively or additionally, the restraining straps can be used to provide additional signal connections. In the preferred embodiment, the restraining straps are formed from the same materials as the signal leads and hence the restraining straps act as electrically conductive leads. However, in the broad compass of the invention, it is possible to form the restraining straps from nonconductive materials such as polymers. The number of restraining straps or restraining straps and the placement of these elements on the surfaces of the elements can be varied. Preferably, where one or both of the elements includes a flexible sheet, restraining straps are dispersed at spaced apart locations over substantially the entire extent of the sheets, so that restraining straps limit vertical movement of each area of the flexible sheet. As disclosed in copending, commonly assigned U.S. Provisional Patent Application No. 60/032,828 filed Dec. 13, 1996, and in the commonly assigned United States Patent Application entitled Microelectronic Assembly Fabrication With Terminal Formation From A Conductive Layer, filed of even date herewith, claiming benefit of said '828 provisional application and naming John W. Smith and Joseph Fjelstad as inventors, the disclosures of which are incorporated by reference herein, a flexible sheet-like element may be provided with a rigid reinforcing element such as a conductive metallic sheet. After movement of the elements to deform the leads, and after formation of a compliant layer between the elements, the rigid reinforcing element can be etched or otherwise treated to remove metal from it and convert the reinforcing element to electrically conductive parts of the assembly such as terminals. This restores flexibility of the flexible element, and allows the terminals to move relative to one another and relative to the opposite element such as the chip or wafer. These techniques can be used in the present invention. When such a rigid reinforcement is provided, the flexible sheet-like element will not tend to bulge out of plane. Therefore, greater spacings can be provided between the restraining straps. Likewise, when both elements are rigid and do not tend to bulge or bend, large spacings can be provided between restraining straps.

Figure 7:
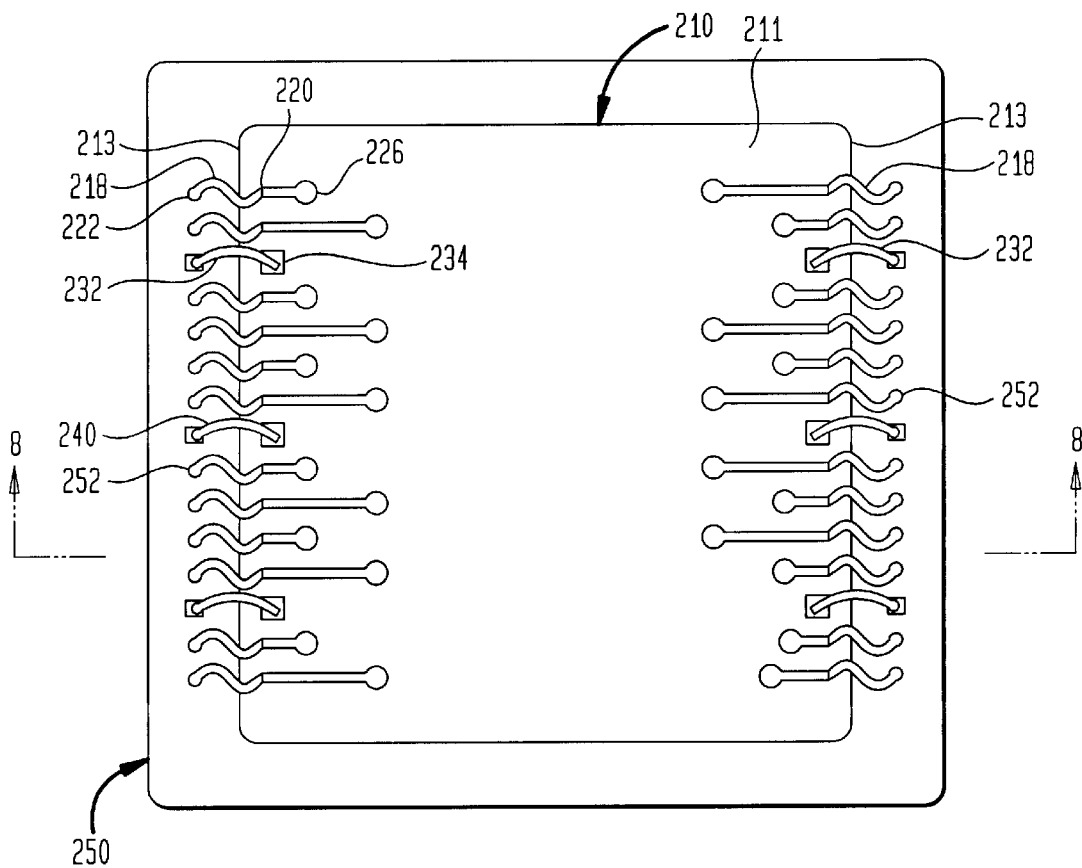
FIG. 7 is a diagrammatic top plan view of an assembly during a process in accordance with a further embodiment of the invention.
Figure 8:
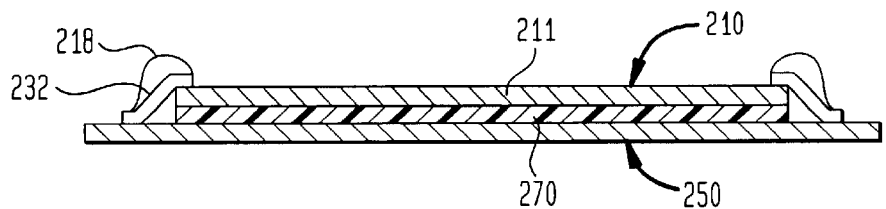
FIG. 8 is a diagrammatic sectional view taken along line 8—8 in FIG. 7.
Figure 9:
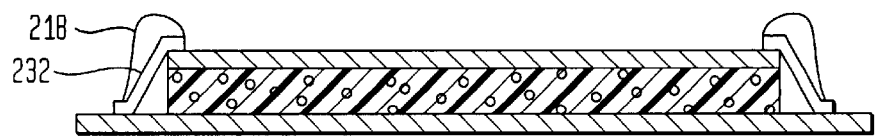
FIG. 9 is a view similar to FIG. 8 but depicting the assembly in a later stage of the process.

An assembly according to a further embodiment of the invention includes a semiconductor chip 250 having rows of contacts 252 along its edges. The assembly further includes a connection component 210 having a dielectric structural element 211 with terminals 226 thereon. In the condition illustrated in FIGS. 7 and 8, signal leads 218 extend horizontally outwardly, beyond edges 213 of the dielectric element. An inner end 220 of each signal lead is fixed to the dielectric structure and electrically connected to a terminal 226 on the dielectric element, whereas the outer or free end 222 of each lead is connected to one of the chip contacts 252. The assembly further includes restraining straps 232, each having a fixed end 234 permanently fastened to the dielectric element and a free end 240 bonded to the chip. The restraining straps are interspersed in the rows of leads. Here again, the restraining straps are shorter and stronger than the leads. The leads are curved. As best seen in FIG. 8, in the initial, unmoved condition of the assembly, leads 218 are curved in both the vertical and horizontal directions, and extend both vertically and horizontally. Leads 218 may be provided as a part of the connection component, or may be formed in place by a process such as wire bonding while the connection component is in place on the chip. Restraining straps 232 are curved, but are shorter than signal leads 218. The restraining straps also may be provided as part of the connection component or may be formed in place, as by wire bonding using a relatively heavy-gauge wire. The assembly further includes a foamable layer 270 disposed between the dielectric element and the chip. The foamable layer may include a thermoplastic or other polymeric material in conjunction with a blowing agent adapted to form a gas upon exposure to heat. As described in greater detail in commonly assigned U.S. Provisional Patent Application No. 60/032,870, the disclosure of which is hereby incorporated by reference herein, such a foamable material will generate a gas under pressure and hence will introduce the gas under pressure between the opposed surfaces of the elements. For example, the blowing agent in the foamable material may be a heat-activated agent.

After the signal conductors and restraining straps are connected between the two elements, foamable layer 270 is activated. The blowing agent introduces a gas under pressure between chip 250 and connection component 210, thus forcing the two elements vertically away from one another and deforming leads 218 to a more vertically-extensive disposition. Here again, the restraining straps arrest the vertical movement of the elements away from one another before the signal leads are pulled taut.

Numerous variations and combinations of the features discussed above can be employed. Thus, structural arrangements other than the via and terminal structures discussed above with reference to FIGS. 1–3 can be used to permanently secure the fixed or terminal ends of the leads and straps to the dielectric structure. For example, the fixed ends of the leads and straps may be securely bonded to the dielectric structure itself. Also, the leads and straps may be electrically connected to traces or to other parts of the connection component which do not mechanically secure the fixed ends. The straps may be formed integrally with potential reference planes such as ground or power planes in connection component. Also, the methods and components according to the FIGS. 1–6 can be used with single chips, rather than with a wafer. Both elements may includes chips or wafers. For example, the present invention can be applied to connect two chips to one another. Further, the methods and components discussed above can be used with assemblies of plural chips, which may remain united in the finished device to form a multichip module. In this case, the connection component and leads may serve to interconnect the chips in the module. Also, the elements may include microelectronic elements other than chips or wafers.

Figure 10:
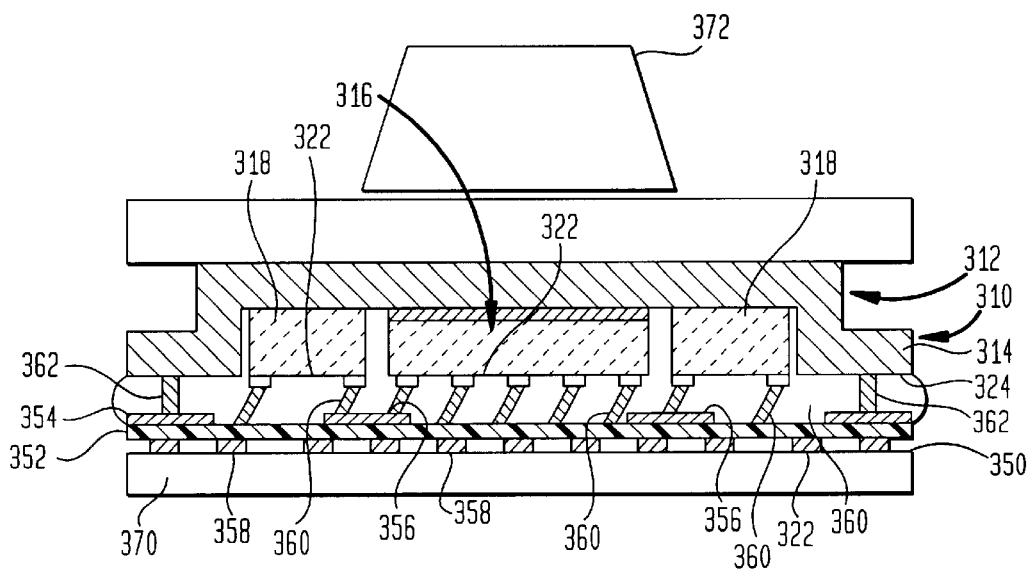
FIG. 10 is a diagrammatic sectional view of an assembly during a process according to a further embodiment of the invention.

For example, in the assembly depicted in FIG. 10, one element 310 is itself an assemblage including a package element 312 in the form of a metallic can having a flange 314 at its periphery, and further including a semiconductor chip 316 and additional electrical elements 318 such as capacitors, inductors, resistors or additional semiconductor chips. The chip and other electrical elements have front surfaces 322 substantially coplanar with the front surface 324 of flange 314. The front surfaces of the flange, together with the front surfaces of the chip and of the other electrical elements cooperatively define the front surface of element 310. The other element 350 is a connection component including a flexible dielectric sheet 352 and one or more metallic potential planes 354. Only one such potential plane is partially shown in FIG. 10. Connection component 350 further includes interconnect leads 356 extending along one or both surfaces of the dielectric sheet, or disposed within the sheet, and also includes terminals 358. Although only a few such leads and terminals are depicted in FIG. 10, numerous leads would be provided in actual practice. Flexible signal leads 360 are connected between connection component 350 and the chip 316 and other electrical components 318 of assemblage 310. The restraining straps 362 are provided only adjacent the periphery of the connection component, and are connected between a potential plane 354 of the connection component and the flange 314 of the package. As described in further detail in the aforementioned U.S. patent application Ser. No. 08/690,532, the terminals and leads may be arranged to provide a "fan-out" arrangement, wherein the terminals 358 are disposed over a surface area larger than the area of chip 316. The interconnect leads 356 and signal leads 360 may be arranged to connect the various electrical components to one another and to the appropriate terminals 358.

During the process used to make this assembly, the terminals 358 of the connection component are disposed in engagement with a flat surface such as a support 370. Package 312 is urged toward the support by a weight 372 or other device for applying a force in the vertical direction without impeding horizontal movement of the package. A fluid such as a liquid encapsulant or foam is provided under pressure between assembly 310 and connection component 350, causing these elements to move vertically away from one another. Here again, the restraining straps 362 constrain the relative motion of the elements. Thus, the restraining straps limit vertical movement of the elements, and cause horizontal movement of the elements relative to one another. Support 370 maintains coplanarity of the terminals 358, and limits bulging of the flexible dielectric member 352.

Figure 11:
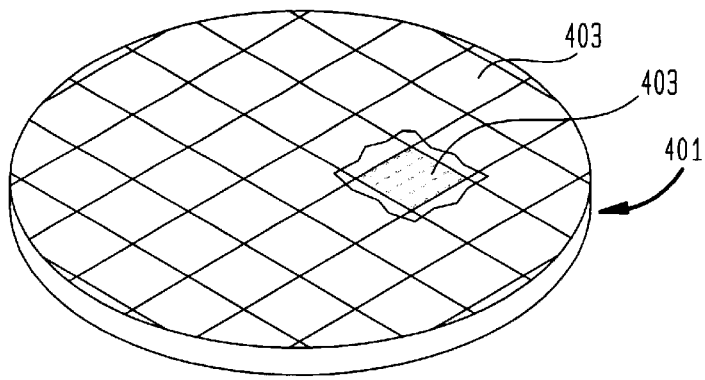
FIG. 11 is a perspective view of a wafer in accordance with a further embodiment of the invention.
Figure 12:
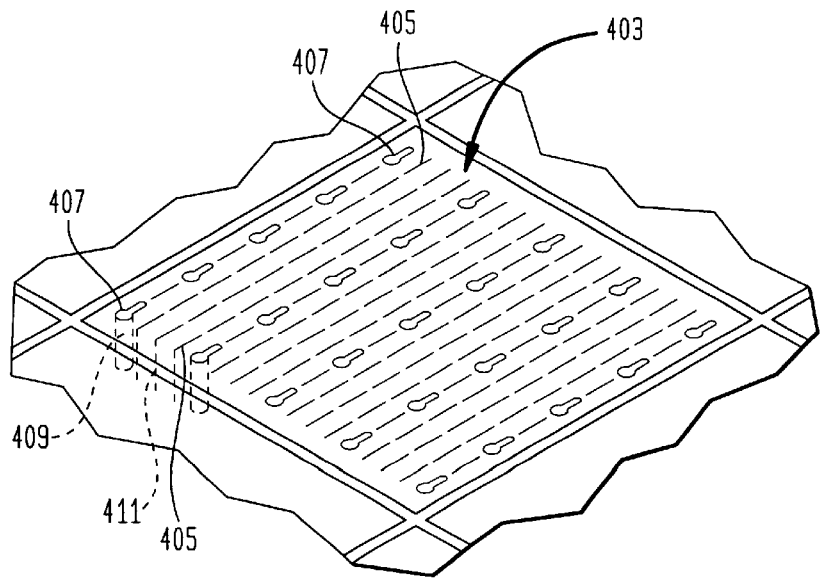
FIG. 12 is a fragmentary, diagrammatic view of a portion of the wafer depicted in FIG. 11.

In a further variant, the structural element which bears the leads and straps prior to assembly may be a semiconductor chip, wafer or other assemblage of plural chips. A unitary semiconductor wafer 401 (FIG. 11) includes a plurality of chips 403. Each chip has numerous signal leads 405 (FIG. 12) and restraining straps 407 disposed on the top, contact-bearing surface of the chip. The signal leads and straps have fixed ends connected to the structural element or wafer 401. The signal leads are connected to signal contacts of each chip, and hence are connected to internal signal connections 411 within the chip. The restraining straps 407 are connected to constant-potential connections or reference contacts 409 such as power or ground connections. As in the embodiments discussed above, the free ends of the leads and straps are releasably secured to the structural element. For example, the wafer may have a layer of a polymer such as polyimide on its top surfaces, and the leads and straps may be connected to the wafer in the same manner as discussed above with reference to leads connected to a dielectric film.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A microelectronic assembly comprising:
   a first microelectronic element including contacts on a contact-bearing face;
   a second microelectronic element confronting said first microelectronic element;
   a plurality of vertically extended signal leads electrically interconnecting said first and second microelectronic elements;
   a plurality of vertically extended straps attached to said first and second microelectronic elements, wherein said straps are shorter than said signal leads for limiting vertical movement of said first and second microelectronic elements away from one another.

2. The microelectronic assembly as claimed in claim 1, wherein said signal leads are longer than said straps so that said signal leads do not constrain vertical movement of said first and second microelectronic elements away from one another.

3. The microelectronic assembly as claimed in claim 1, wherein said signal leads are partially curved.

4. The microelectronic assembly as claimed in claim 1, wherein said straps are substantially straight and fully extended for arresting vertical movement of said first and second elements away from one another.

5. The microelectronic assembly as claimed in claim 1, wherein said straps are stronger than said signal leads.

6. The microelectronic assembly as claimed in claim 1, wherein said straps are thicker than said signal leads.

7. The microelectronic assembly as claimed in claim 1, wherein said straps are less numerous than said signal leads.

8. The microelectronic assembly as claimed in claim 1, wherein said signal leads have fixed ends permanently attached to said second microelectronic element and free ends bonded to the contacts of said first microelectronic element.

9. The microelectronic assembly as claimed in claim 8, wherein the fixed ends of said signal leads are electrically interconnected with terminals accessible at a surface of said second microelectronic element.

10. The microelectronic assembly as claimed in claim 1, wherein said straps have fixed ends permanently attached to said second microelectronic element and free ends bonded to said first microelectronic element.

11. The microelectronic assembly as claimed in claim 10, wherein the free ends of said straps are bonded to the contact-bearing face of said first microelectronic element.

12. The microelectronic assembly as claimed in claim 10, wherein the free ends of said straps are bonded to one or more of the contacts of said first microelectronic element.

13. The microelectronic assembly as claimed in claim 1, wherein said first and second microelectronic elements include constant-potential connections and wherein at least one of said straps electrically interconnects the constant-potential connections of said first and second microelectronic elements.

14. The microelectronic assembly as claimed in claim 1, wherein some of said straps are connected to a first potential plane serving as a power plane and other said straps are connected to a second potential plane serving as a ground reference plane.

15. The microelectronic assembly as claimed in claim 1, wherein said straps have larger cross-sectional areas than said signal leads.

16. The microelectronic assembly as claimed in claim 1, wherein one of said first and second microelectronic elements includes a wafer having a plurality of semiconductor chips and the other said microelectronic element includes one or more connection components.

17. The microelectronic assembly as claimed in claim 16, wherein said wafer is severable for forming individual units each including one or more semiconductor chips and a part of said one or more connection components connected to the chips in such unit.

18. The microelectronic assembly as claimed in claim 1, wherein said first and second microelectronic elements include opposing, horizontally-extending surfaces that confront one another, wherein said signal leads and said straps are disposed between said opposed surfaces.

19. The microelectronic element as claimed in claim 10, wherein the fixed ends of said straps and the free ends of said straps are offset from one another in a first horizontal direction, wherein said straps constrain movement of said first and second microelectronic elements away from one another in said first horizontal direction.

20. The microelectronic assembly as claimed in claim 1, further comprising a compliant layer extending between said first and second microelectronic elements.

21. The microelectronic assembly as claimed in claim 20, wherein said compliant layer covers at least some of said signal leads and straps.

22. The microelectronic assembly as claimed in claim 1, wherein said straps and said signal leads are made of a common electrically conductive material.

23. The microelectronic assembly as claimed in claim 1, wherein at least some of said straps are made of nonconductive materials.

24. The microelectronic assembly as claimed in claim 23, wherein one of said first and second microelectronic elements includes a conductive metallic sheet.

25. The microelectronic assembly as claimed in claim 1, wherein said first microelectronic element includes a semiconductor chip having rows of contacts along its edges and said second microelectronic element includes a connection component having a dielectric structural element with terminals thereon, and wherein said signal leads extend beyond peripheral edges of said dielectric element.

26. The microelectronic assembly as claimed in claim 25, wherein said signal leads have inner ends electrically connected to said terminals on said dielectric structure and outer ends connected to one of said chip contacts.

27. The microelectronic assembly as claimed in claim 26, wherein said straps have fixed ends permanently secured to said dielectric element and free ends bonded to said chip.

28. The microelectronic assembly as claimed in claim 25, wherein said straps are interspersed in the rows of said signal leads.

29. A microelectronic assembly comprising:
a first microelectronic element including contacts on a contact-bearing face;
a second microelectronic element juxtaposed with said first microelectronic element;
a plurality of vertically extended signal leads electrically interconnecting said first and second microelectronic elements;
a plurality of vertically extended straps attached to said first and second microelectronic elements, wherein said straps are shorter and stronger than said signal leads for limiting vertical movement of said first and second microelectronic elements away from one another.

30. The microelectronic assembly as claimed in claim 29, wherein said signal leads are longer than said straps so that said signal leads do not constrain vertical movement of said first and second microelectronic elements away from one another.

31. The microelectronic assembly as claimed in claim 30, wherein said signal leads are partially curved.

32. The microelectronic assembly as claimed in claim 29, wherein said first microelectronic element includes a semiconductor chip and said second microelectronic element includes a dielectric substrate.

33. The microelectronic assembly as claimed in claim 29, wherein one of said first and second microelectronic elements includes a wafer having a plurality of semiconductor chips and the other of said microelectronic elements includes one or more connection components.

34. The microelectronic element as claimed in claim 33, wherein said wafer is severable for forming individual units each including one or more semiconductor chips and a part of said one or more connection components connected to the chips in such unit.

35. The microelectronic assembly as claimed in claim 29, wherein said first and second microelectronic elements include opposing, horizontally-extending surfaces that confront one another, wherein said signal leads and said straps are disposed between said opposed surfaces.

36. The microelectronic assembly as claimed in claim 29, wherein said straps are substantially straight and fully extended for arresting vertical movement of said first and second elements away from one another.

37. A microelectronic assembly comprising:
- a first microelectronic element having rows of contacts along one or more edges thereof;
- a second microelectronic element juxtaposed with said first microelectronic element, said second microelectronic element having conductive terminals;
  - a plurality of signal leads electrically interconnecting said first and second microelectronic elements, wherein each said signal lead has an inner end electrically connected with one of said terminals and an outer end electrically connected with one of said contacts;
  - a plurality of restraining straps having fixed ends permanently fastened to said second microelectronic element and free ends connected to said first microelectronic element, wherein said restraining straps are shorter than said signal leads for limiting vertical movement of said first and second microelectronic elements away from one another.

38. The microelectronic assembly as claimed in claim 37, wherein said signal leads are longer than said straps 50 that said signal leads do not constrain movement of said first and second microelectronic elements relative to one another.

39. The microelectronic assembly as claimed in claim 37, wherein said signal leads are partially curved.

40. The microelectronic assembly as claimed in claim 37, wherein said straps are substantially straight and fully extend for arresting vertical movement of said first and second microelectronic elements away from one another.

41. The microelectronic assembly as claimed in claim 37, wherein said straps are stronger than said signal leads.

42. The microelectronic assembly as claimed in claim 37, wherein said straps are thicker than said signal leads.

43. The microelectronic assembly as claimed in claim 37, wherein said straps are less numerous than said signal lead.

44. The microelectronic assembly as claimed in claim 37, further comprising a compliant layer extending between said first and second microelectronic elements.

* * * * *

UNITED STATES PATENT AND TRADEMARK OFFICE
CERTIFICATE OF CORRECTION

PATENT NO. : 6,362,520 B2
DATED : March 26, 2002
INVENTOR(S) : Thomas H. DiStefano It is certified that error appears in the above-identified patent and that said Letters Patent is hereby corrected as shown below:

Column 2,
Line 11, "making a microelectronic" should read -- making microelectronic --.

Column 3,
Line 39, "end of each the lead" should read -- end of each lead --.
Line 41, "end of each the lead" should read -- end of each lead --.

Column 4,
Line 23, after "such" insert -- as --.

Column 7,
Line 32, after "150" insert -- . --.

Column 9,
Line 34, "includes" should read -- include --.

Column 14,
Line 7, "50" should read -- so --.

Signed and Sealed this

Eleventh Day of June, 2002

Attest:

JAMES E. ROGAN
Attesting Officer — Director of the United States Patent and Trademark Office